United States Patent

Dumbeck

[11] 4,194,129
[45] Mar. 18, 1980

[54] ARMATURE SLIP ANALYSIS OF INDUCTION MOTORS WITH TEMPERATURE AND VOLTAGE CORRECTION

[75] Inventor: Robert F. Dumbeck, Elgin, Tex.

[73] Assignee: Rexnord Inc., Milwaukee, Wis.

[21] Appl. No.: 858,674

[22] Filed: Dec. 8, 1977

Related U.S. Application Data

[63] Continuation-in-part of Ser. No. 675,780, Apr. 12, 1976, Pat. No. 4,063,112, which is a continuation-in-part of Ser. No. 548,011, Feb. 7, 1975, abandoned.

[51] Int. Cl.² .............................................. H02K 11/00
[52] U.S. Cl. .................................... 307/149; 318/490; 324/161
[58] Field of Search ................ 307/116, 149; 318/490, 318/798, 799, 806; 324/161, 177, 158 MG, 158 P, 160; 328/3

[56] References Cited

U.S. PATENT DOCUMENTS

| | | | |
|---|---|---|---|
| 2,548,307 | 4/1951 | Hall | 318/490 |
| 2,912,644 | 11/1959 | Makous | 324/158 MG |
| 3,052,117 | 9/1962 | Miller | 324/158 MG |
| 3,885,420 | 5/1975 | Wolfinger | 324/161 |
| 3,987,394 | 10/1976 | Hoh | 324/160 |
| 4,006,417 | 2/1977 | Pace | 324/161 |

*Primary Examiner*—L. T. Hix
*Assistant Examiner*—S. D. Schreyer

[57] ABSTRACT

Loading of induction motors is monitored and displayed by meters or alarms by analyzing slip of the armature derived from pulse signals indicating motor shaft speed. A special sensor sensing the motor shaft rotation also provides motor operating temperature signals accompanying shaft rotation speed signals. Corresponding circuitry compensates the load display over motor temperature variations. Also, the motor operating voltage is detected and voltage variations are processed to modify the load display for improved accuracy in the presence of voltage variations and by linearization of the slip characteristic.

6 Claims, 9 Drawing Figures

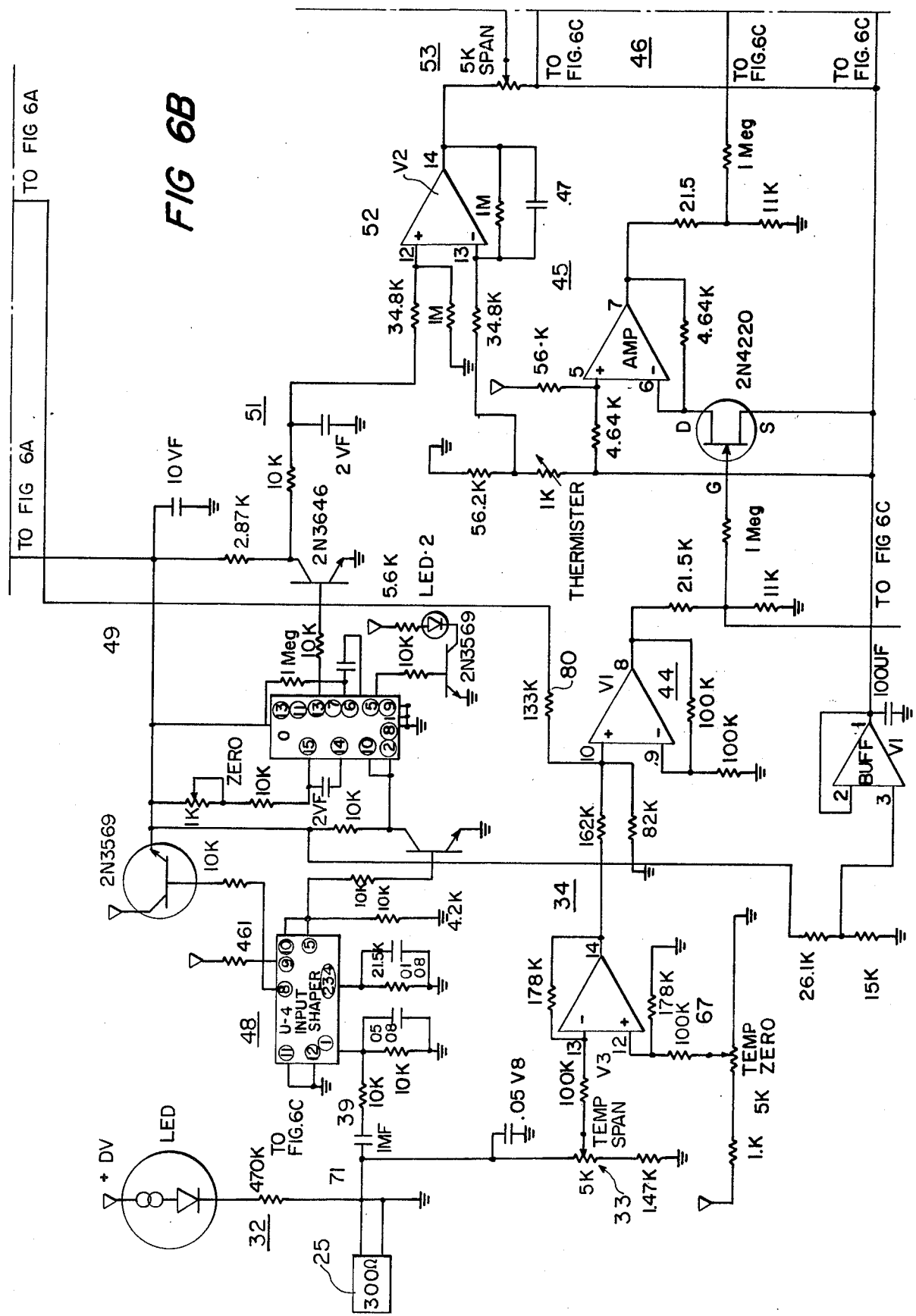

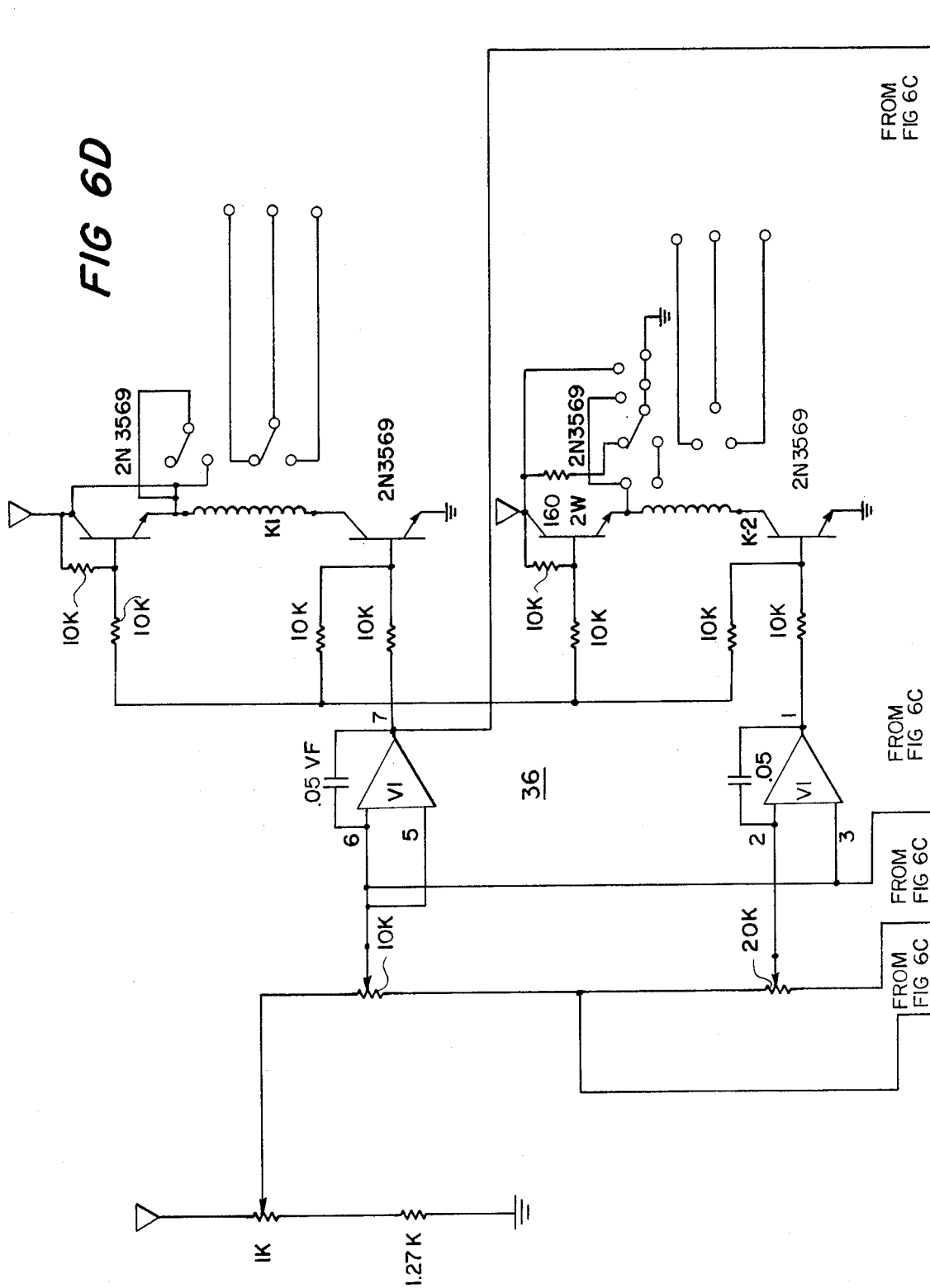

ARMATURE SLIP ANALYSIS OF INDUCTION MOTORS WITH TEMPERATURE AND VOLTAGE CORRECTION

This is a continuation-in-part application of my copending application Ser. No. 675,780 filed Apr. 12, 1976, now U.S. Pat. No. 4,063,112, issued Dec. 13, 1977, which in turn is a continuation-in-part of my earlier filed application Ser. No. 548,011 filed Feb. 7, 1975, now abandoned.

This invention, as the preceding applications, relates to motor load monitoring and control apparatus and more specifically it relates to measurement of induction motor slip speed to produce electronic signals representative of motor load conditions.

BACKGROUND OF THE INVENTION

For purpose of proper understanding of the background of this invention and to avoid the repetition of details herein not primarily relating to the advance in the art contributed by this invention, the preceding application is incorporated herein by reference in its entirety, and will only be reproduced herein to the extent that the relationship between the prior application and this invention is understood. Thus, various circuits for load and alarm indication by means of slip analysis is shown and described adequately in said U.S. patent, and is not repeated herein. However, circuit configurations are shown herein showing how to compensate for variations in temperature and voltage to improve the accuracy of load indications derived by slip analysis. The said patent together with patent references of record therein constitutes the best known prior art.

While the former patent provides an output signal indicating motor load as a function of armature slip and works well with 5 to 10% accuracy requirements, it is limited where improved preciseness and accuracy is desired. Particularly with large horsepower industrial motors, there is a significant change of armature slip with motor operating temperatures. Thus, if accuracy of the readings under these operating characteristics is to be kept within 1% to 5%, the previous systems are not acceptable. Furthermore, changes of applied motor voltage also causes variations of armature slip that may prevent readings from being accurate under all conditions within the desired improved accuracy limits.

Another problem with motor load metering and monitoring systems and particularly those of a type not operable on an armature slip analysis, is the need to retrofit motors in the field with access to complex electric wiring, armature current, etc. There is no really low cost simplified retrofit or even factory installed monitoring system available that produces high accuracy loading signals or displays.

Also, armature slip characteristics have not previously been understood properly so that they could be processed for highly precise and accurate load indications. For example, the effect of motor temperature and motor voltage upon slip characteristics has not been taken into account in previous load monitoring systems dependent upon slip analysis.

In order to make temperature and/or voltage corrections to improve accuracies in prior art load monitoring systems such as those operating from armature current characteristics, or from interpretation of mechanical distortions such as shaft torque, difficulties are imposed because of incompatibility of sensors, signals and relationships between motor, load, temperature and voltage characteristics. Thus, very complex equipment including a plurality of sensors at different locations providing mounting, connecting and interfacing problems would be necessary for correcting load signals to produce more precise and accurate displays.

OBJECTS OF THE INVENTION

It is therefore an object of this invention to improve the accuracy of load signals derived as a function of induction motor armature slip, particularly with simple and inexpensive monitoring and metering apparatus.

It is a more specific object of the invention to produce output load display from induction motor slip analysis having motor temperature compensation.

Another more specific object of the invention is to produce output load display from induction motor slip analysis having motor voltage compensation.

Another object of the invention is to provide simple, inexpensive, compact motor load metering and monitoring equipment with sensors which can be installed readily at the time of manufacture to serve in a compatible load monitoring system producing high accuracy load displays.

BRIEF DESCRIPTION OF THE INVENTION

This invention recognizes that both temperature and voltage affect the slip characteristic of an induction motor armature and provides novel sensing probes and compensation circuitry to provide more highly accurate measurements of load by slip analysis.

A single probe compatible with mounting inside a motor casing during manufacture gives self induced a-c pulses from a permanent magnetic field pattern cut by a ferromagnetic marker on the rotary shaft of the motor, and has a calibrated resistive winding variable in resistance with temperature that provides a d-c signal. Thus, a signal varying as a function of motor operating temperature can be derived by passing a constant current source flowing therethrough.

The motor voltage is transformed by an unregulated d-c power supply to a d-c signal mergeable with the d-c temperature signal to produce a combined temperature-voltage correction signal for modifying the load display produced from the a-c pulses, thereby producing a highly accurate and precise load signal display over a wide range of operating conditions.

THE DRAWING

These and further objectives, features and advantages of the invention are found throughout the following specification, with reference to the accompanying drawing, wherein:

FIGS. 6A through 6D together comprise a schematic circuit diagram showing in more detail typical circuitry useful in practicing this invention.

THE DETAILED SPECIFICATION

Figure 1:
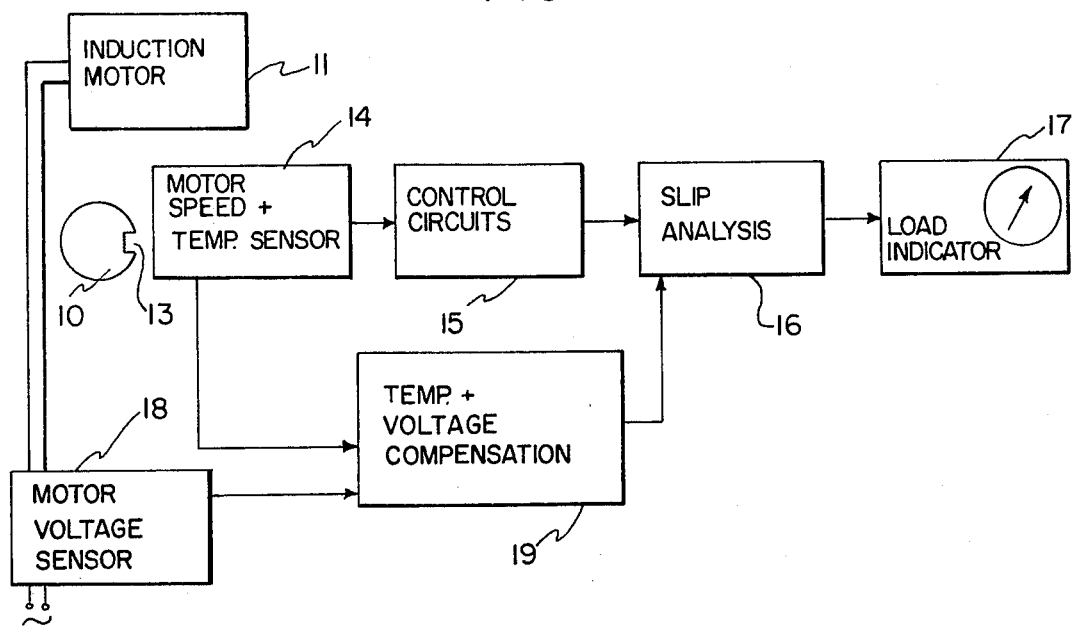
FIG. 1 is a general block schematic drawing of a system incorporating the invention.

The general system configuration may be seen from the block diagram of FIG. 1. Thus the shaft 10 rotated by an induction motor 11, has a ferromagnetic marker such as a projection or groove 13 which is presented at least once for each shaft rotation. This provides, by means of a motor speed sensor within transducer arrangement 14, a set of signal pulses which are processed through control circuits 15 and slip analysis circuits 16 to provide a load monitoring or metering display at load indicator 17. These circuits and this system thus far described is described in detail in said predecessor patent.

In accordance with this present invention the transducer arrangement 14 also includes motor temperature sensing means and the voltage sensor 18 providing signals representative of motor voltage variations. Thus, temperature and voltage compensation circuitry 19 provides a display at load indicator 17 compensated for temperature and voltage variations and therefore capable of better accuracy and precision than heretofore attainable.

Figure 3:
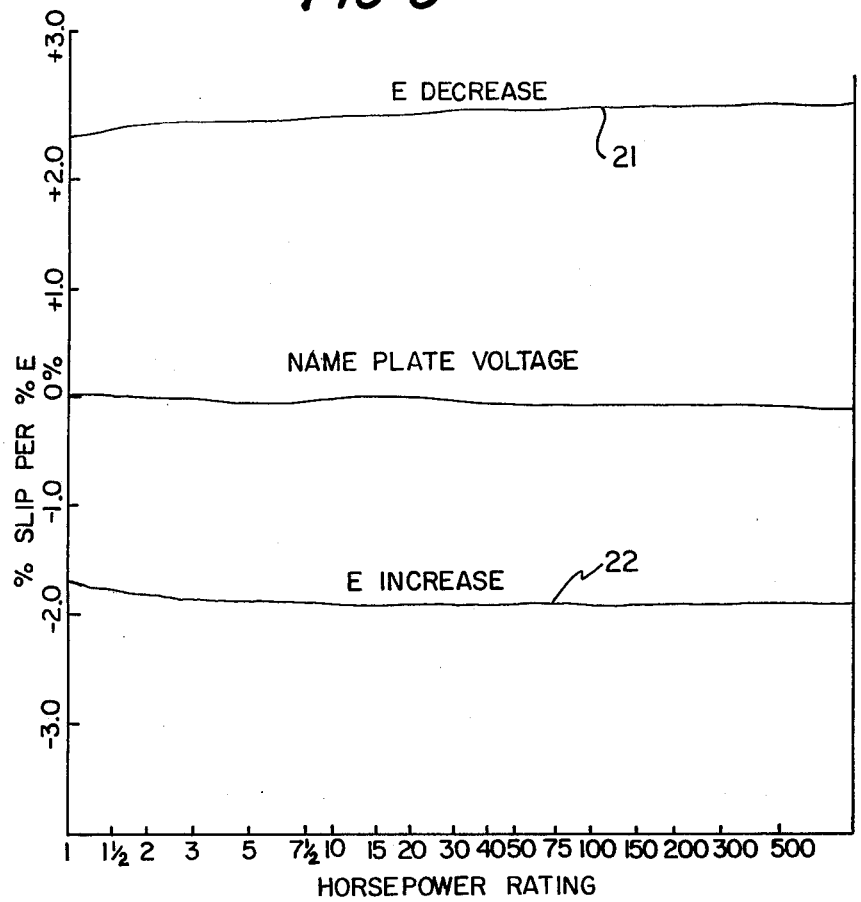
FIG. 3 is a graph showing the function of voltage changes on slip in induction motors.
Figure 2:
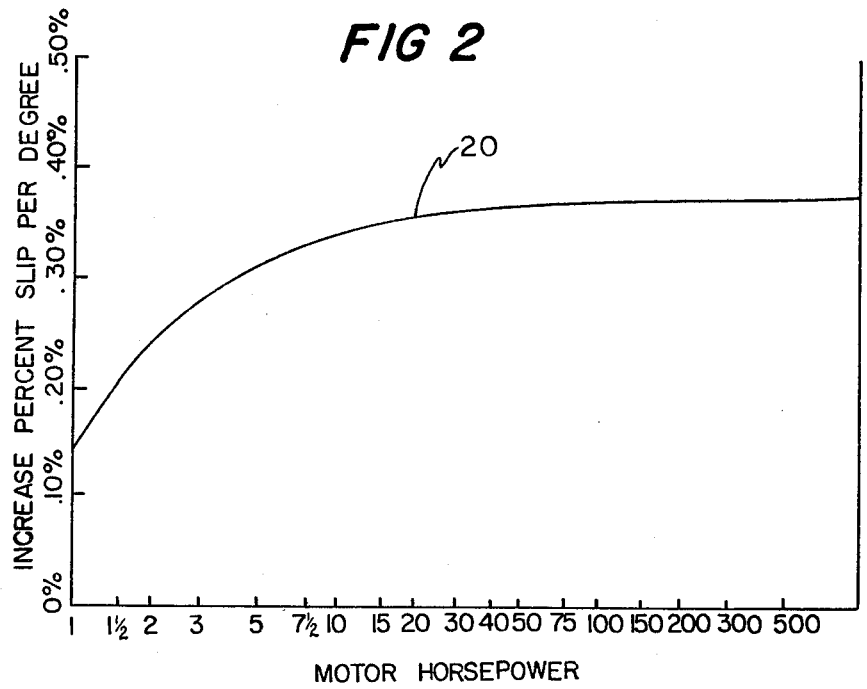
FIG. 2 is a graph showing the function of temperature changes on slip in induction motors.

As may be seen from the graphs of FIGS. 2 and 3, it has been found as a basis for the operating principles of this invention that armature slip of induction motors varies with temperature and voltage in the manner graphed.

Thus, in FIG. 2 it is evident once the curve 20 is derived, as shown displayed on the logarithmic horsepower abscissa and the linear slip characteristic ordinate, that the slip varies as a function of temperature change and motor size. Thus, for the four pole motors charted to display this characteristic, an appropriate sensing of temperature permits a correction factor of known characteristics to be introduced into a slip reading load metering circuit of the type provided in my aforesaid patent, thereby to increase accuracy and precision over a variable range of load conditions at different motor temperatures.

Similarly, FIG. 3 has curves 21, 22 respectively displaying on the linear slip-with-voltage ordinate, the percentage slip change with the percentage voltage decrease and increase respectively. This permits also a correction factor for changes in motor operating voltage.

Figure 4:
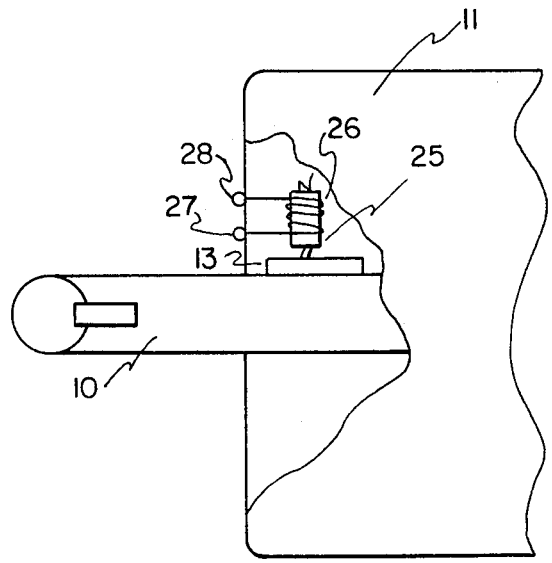
FIG. 4 is a diagrammatic and schematic view of a multiple-function sensor probe afforded by the invention adopted for compact mounting inside the motor housing.

As may be seen from FIG. 4, the motor 11 has a protruding shaft 10 and is broken away to show inside the motor housing a ferromagnetic shaft marker 13 such as a protruberance or groove in the iron shaft body. This is sensed to count motor revolutions, and thus provides a motor speed indication of the type used to process by slip analysis a load indication. Mounted by any convenient means such as a non-ferric metal bracket is a sensor with a permanent magnet rod transducer 25 with winding coil 26 leading to terminals 27, 28. Thus, the shaft marker 13 cuts the magnetic field produced by the magnet as the shaft rotates and induces a-c pulses in coil 26 for sensing shaft speed.

The sensor is preferably a circular rod ½ inch (1.27 cm) long by 0.125" (0.32 cm) diameter with 2550 turns of 99% pure copper wire 1.5 mil (0.0038 cm) diameter, with insulation coating, wound over the full length layer over layer (about eight layers). This assembly is then covered with silicon rubber for shock protection, insulation and strain relief to prevent shearing of the fine wire. This is then potted in epoxy within an aluminum tube with the magnet rod flush at the pickup end, and rubberized cylindrically to withstand considerable shock and operate at temperatures elevated to about 300° F. It is small enough for mounting in a motor housing during manufacture for connection to appropriate instrumentation either in the factory or in the field.

This transducer 25 also serves a dual function, thereby comprising a temperature sensor, since the 300 ohm wire wound fixed resistor coil has a known temperature-resistance of 0.0041 ohm per ohm per °C. change, that is sensed with any appropriate resistance detector.

Figure 5:
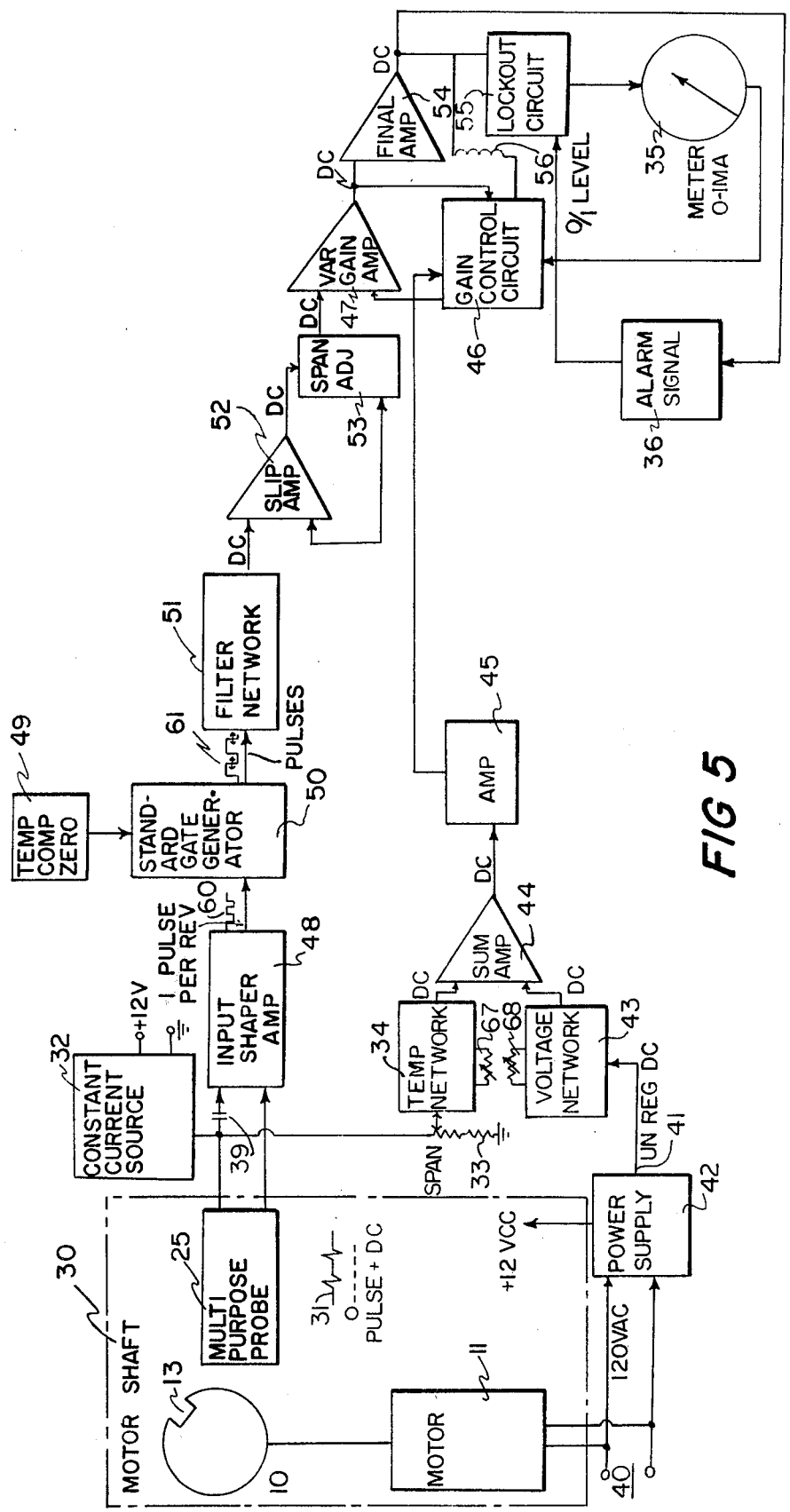
FIG. 5 is a schematic block diagram of an improved accuracy motor load monitoring and display system afforded by this invention.

As may be seen from the block diagram of FIG. 5, this transducer 25 is mounted within housing 30 of motor 11, to sense marker 13 on motor shaft 10 and produce a-c pulses 31. A d-c level is established by constant current source 32 at +3.2 Vdc such that current flowing through transducer 25 and resistor 33 provides a d-c level to temperature network 34 that varies with motor temperature, and thus serves to improve the accuracy of load readings on meter 35, or alarm 36, as derived by slip analysis circuitry of the kind described in the aforesaid patent. Part of this diagram constitutes one-line signal path convention, since those skilled in the art can adequately provide appropriate voltage and ground connections throughout.

Input power terminals 40 supply motor 11 with operating voltage and the unregulated lead 41 of power supply 42, also operated from input terminals 40, produces in voltage network 43 a d-c signal varying as the motor voltage thereby to permit a voltage correction function for the load readings in the manner aforesaid.

Thus, a d-c mixer circuit such as the summing amplifier 44 provides a merged single d-c correction voltage amplified at 45 and inserted at gain control circuit 46, which can be adjusted for appropriate correction weight in the load reading as inserted into variable gain amplifier 47 to merge with the speed signals as manipulated in the slip analysis circuits, which derive via capacitor 39 the a-c pulses processed through circuits 48, 49, 50, 52 and 53. These circuits as well as amplifier 54 and lockout circuit 55 are amply described in function in the aforesaid patent incorporated herein by way of reference.

In a preferred embodiment, the a-c pulses 31 when shaped and spaced will be filtered to give an analog d-c signal that varies with motor speed thus being proportional to slip and indicating a motor load readout. This is a simple low cost technique. However, other slip analysis circuits, such as digital analyzers may be used if desired.

Alarm signal 36 is supplied for overload display and control of electrical relays, etc. as desired. It is seen therefore that this invention provides for adding correction signals for variations in temperature and voltage encountered by motor 11 so that the load display on meter 35 or alarm 36 will be more accurate and precise over a range of temperature and voltage variation.

Figure 6A:
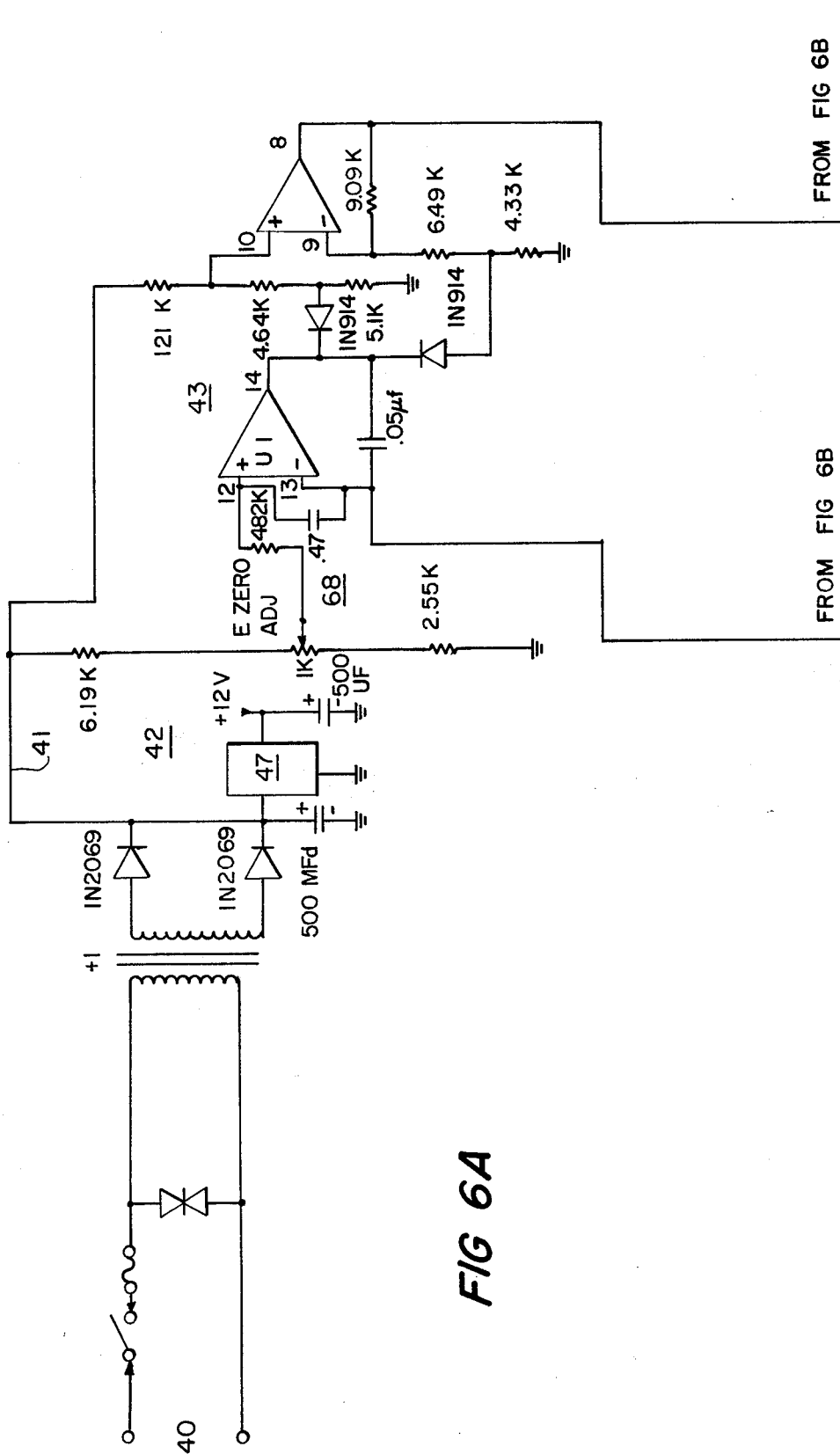
Figure 6C:
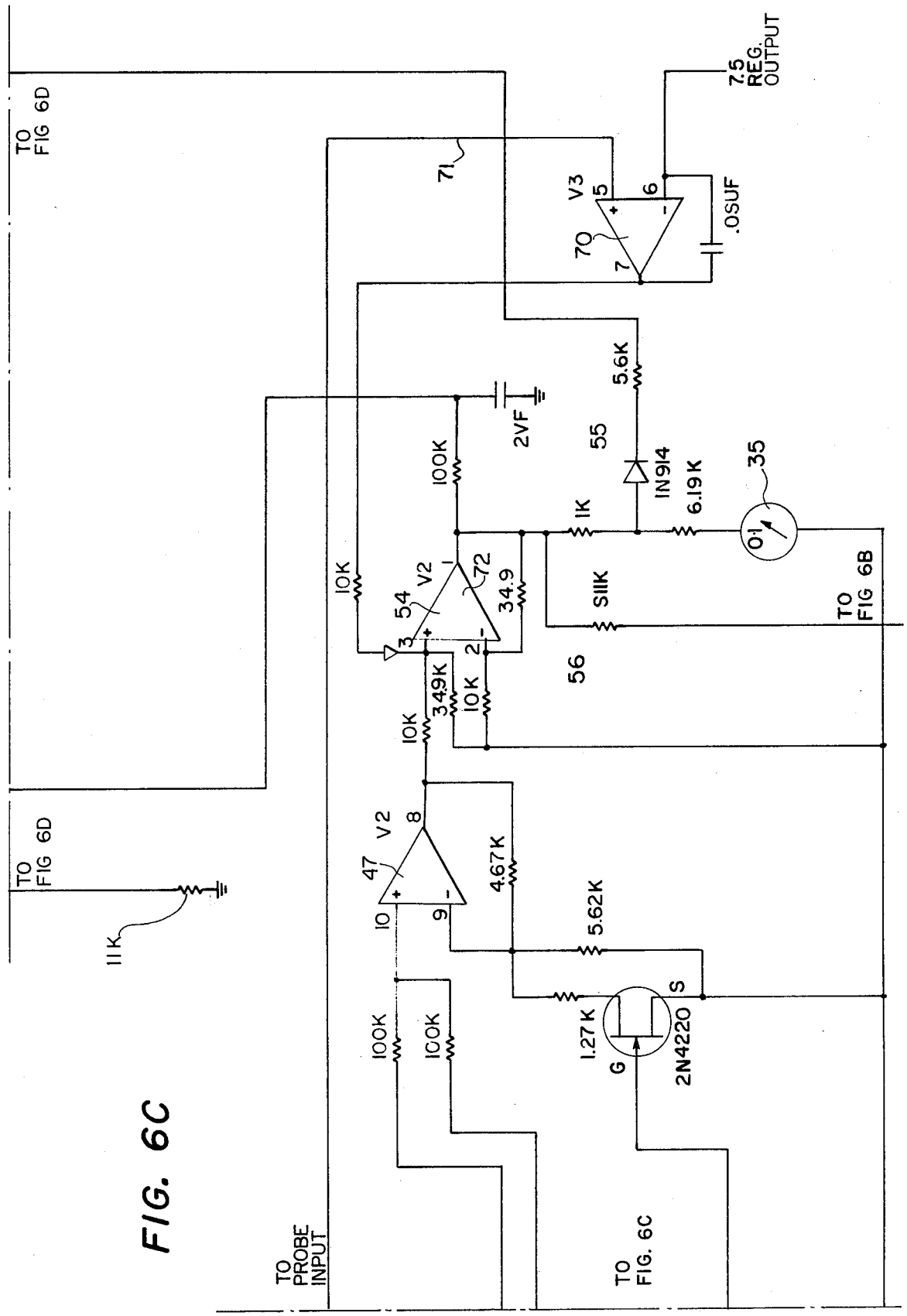

The circuit of FIG. 5, and the following more detailed corresponding schematic circuit of FIG. 6, operate as follows:

The pulses 31 derived by the permanent magnet transducer 25 from rotation of motor shaft 10 are a-c coupled by condensor 39 to pulse shaper circuit 48 to produce shaped square wave pulses 60. These pulses are processed through gate generator 50 to provide a set of pulses 61 of longer duration derived from the spacings between pulses 60, which as noted by the arrows have variable width depending on shaft 10 rotation speed. Thus, as the shaft speed diminishes by heavier load, the pulses represent the slip characteristic of the induction motor 11.

Filter network 51 converts pulses 61 to a varying analog d-c level which can operate output meter 35 after amplification at 52, 47 and 54. To calibrate the instrument, span adjust 53 is supplied, and to permit a remote control operation after a preset load is exceeded, alarm signal 36 and meter lockout circuit 55 are provided.

The variable gain control circuit 46 inserts a properly calibrated amount of d-c signal to compensate for temperature and voltage change errors in slip vs. load characteristics in the manner aforesaid, as amplified at 44, 45 from the sensed d-c signals of temperature network 34 and voltage network 43, each of which preferably has an adjustment capability represented by controls 67, 68. To linearize the slip characteristic, a feedback resistor 56 provides 3% positive feedback from amplifier 54 to gain control circuit 46.

All the circuits themselves are conventional as shown from the following schematic circuit wherein the following commercial circuit chips are used:

U-1, 2, 3. National LM324 N Quad. Operational Amp.
U-4. National 2917 N tachometer chip.
U-5. National 74C221 N Dual one shot.
U-7. LM340+12 Volt. Reg.
LED. National NSL4944.

This circuit details are shown in schematic circuit diagram form in FIGS. 6A through 6D with like reference characters indicating similar block diagram circuitry underlined, and wherein the circuit component values are indicated for each standard element.

Accordingly, this invention provides instrumentation measuring motor load of an induction motor by slip analysis of the armature with appropriate compensation for changes of motor temperature and voltage to thereby improve accuracies heretofore obtainable over a wide range of operating conditions. The prior equipment operated satisfactorily at a known temperature and voltage such as at rated temperature and voltage. However, when equipment monitors a load of a motor in use, these parameters are likely to change and thus the present invention is better adapted to monitor a motor driven loaded industrial system where the motor temperature is hotter than rated because of environment or load conditions, and where the voltage also may change for various reasons.

A lcokout circuit comprising lead 71 from amplifier 70 as fed back to lockout amplifier 72 functions to lock out the load indicating circuit should the probe 25 have an open circuit.

In a typical application of the invention the motor may be a Gould 1 HP, 1725 RPM "FL" 3 phase, 60 Hz, 230/460 volt class B totally enclosed and fan cooled model. The voltage variation characteristic for this particular motor displays an increase of 2.6133% of slip percent of voltage decrease and a decrease of 1.5681% of voltage increase.

Having improved the state of the art, those novel features believed descriptive of the spirit and nature of the invention are defined with particularity in the appended claims.

What is claimed is:

1. A load indication system for displaying a load signal of an induction motor, comprising in combination means for measuring armature slip from electric pulses derived from motor shaft rotation speed, means responsive to motor temperature to produce a temperature correction signal, means for producing a load display signal derived from joint action of the pulses and the temperature correction signal thereby improving the accuracy of said display signal due to variations of motor operating temperature, means for applying voltage to operate said motor, means coupled thereto for sensing variations of said voltage and producing a signal that is a measure of said voltage variations, and means responsive to the voltage variation signal further modifying the load display signal in response to variations of motor operating voltage.

2. A load indication system according to claim 1 wherein said means for measuring armature slip comprises a filter circuit, which converts pulses derived from motor shaft speed to a signal that varies as motor slip varies.

3. A load indication system according to claim 2 wherein said temperature correction signal and said voltage variation signal are processed to produce a correction signal that is a measure of the combined effect of temperature and voltage variations.

4. A load indication system according to claim 3 further comprising means for applying said temperature and voltage variation correction signal to compensate for temperature and voltage variation effects on armature slip vs. load characteristics of the motor.

5. A load indication system for displaying a load signal of an induction motor, comprising in combination means for measuring armature slip from electric pulses derived from motor shaft rotation speed, means responsive to motor temperature to produce a temperature correction signal, means for producing a load display signal derived from joint action of the pulses and the temperature correction signal thereby improving the accuracy of said display signal due to variations of motor operating temperature, and feedback means processing the load display signal to improve linearization of the slip characteristic.

6. A load indication system for displaying a load signal of an induction motor, comprising in combination means for measuring armature slip from electric pulses derived from motor shaft rotation speed, means responsive to motor temperature to produce a temperature correction signal, and means for producing a load display signal derived from joint action of the pulses and the temperature correction signal thereby improving the accuracy of said display signal due to variations of motor operating temperature, said means for measuring armature slip comprising a wound magnetic probe and having lock out means responsive to an open circuit of said probe to disable the display signal.

* * * * *